United States Patent
Kwon (10) Patent No.: US 7,834,547 B2
(45) Date of Patent: Nov. 16, 2010

(54) ORGANIC LIGHT EMITTING DIODE DISPLAY DEVICE AND METHOD OF FABRICATING THE SAME

(75) Inventor: Jung-Hyun Kwon, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 200 days.

(21) Appl. No.: 12/006,666

(22) Filed: Jan. 3, 2008

(65) Prior Publication Data

US 2008/0180024 A1    Jul. 31, 2008

(30) Foreign Application Priority Data

Jan. 4, 2007    (KR)    ............... 10-2007-0001027

(51) Int. Cl.
*H01J 1/62* (2006.01)
(52) U.S. Cl. ............... 313/506; 313/504; 313/509
(58) Field of Classification Search ......... 313/498–512; 445/24
See application file for complete search history.

(56) References Cited

U.S. PATENT DOCUMENTS

| | | | |
|---|---|---|---|
| 2003/0062518 A1* | 4/2003 | Auch et al. ............... | 257/40 |
| 2003/0189400 A1 | 10/2003 | Nishio et al. | |
| 2004/0119419 A1 | 6/2004 | Kai et al. | |
| 2004/0185604 A1* | 9/2004 | Park et al. ............... | 438/149 |
| 2005/0212413 A1* | 9/2005 | Matsuura et al. ............ | 313/504 |
| 2006/0097263 A1 | 5/2006 | Lee et al. | |
| 2006/0290271 A1* | 12/2006 | Cok ............... | 313/504 |
| 2007/0190673 A1 | 8/2007 | Ko et al. | |
| 2007/0210706 A1* | 9/2007 | Song et al. ............... | 313/506 |
| 2008/0018229 A1 | 1/2008 | Yamazaki | |

FOREIGN PATENT DOCUMENTS

| | | |
|---|---|---|
| EP | 1 482 572 A1 | 12/2004 |
| EP | 1 942 526 A2 | 7/2008 |
| JP | H07-270806 | 10/1995 |
| JP | 2003-347041 | 12/2003 |
| JP | 2004-047458 | 2/2004 |
| JP | 2005-011793 | 1/2005 |
| JP | 2005-505114 | 2/2005 |
| JP | 2005-510035 | 4/2005 |
| JP | 2006-126817 | 5/2006 |
| KR | 10-2005-0030296 | 3/2005 |
| KR | 10-2006-0051830 | 5/2006 |

(Continued)

OTHER PUBLICATIONS

European Search Report for European Patent Application No. 09150625.3-1235 dated Apr. 21, 2009.

(Continued)

*Primary Examiner*—Bumsuk Won
(74) *Attorney, Agent, or Firm*—Knobbe Martens Olson & Bear LLP (57) ABSTRACT

An organic light emitting diode (OLED) display device is disclosed. In one embodiment, the OLED device includes a plurality of ball-shaped spacers formed over a pixel defining layer. At least one embodiment can prevent the pixel defining layer from being damaged due to unevenness of a deposition mask. Also, one embodiment of the invention does not require a patterning process for forming a spacer.

24 Claims, 11 Drawing Sheets

FOREIGN PATENT DOCUMENTS

| KR | 10-0793546 | 1/2008 |
| KR | 10-0796618 B1 | 1/2008 |

OTHER PUBLICATIONS

European Search Report for European Patent Application No. 08250034.9-1235 dated Apr. 23, 2009.

The First Office Action for Chinese Patent Application No. 2008100015069 dated Jun. 12, 2009 by The State Intellectual Property Office of P.R.China.

Korean Patent Registration Gazette dated Oct. 22, 2009 for corresponding Korean Application No. 10-2008-0010244.

* cited by examiner

ORGANIC LIGHT EMITTING DIODE DISPLAY DEVICE AND METHOD OF FABRICATING THE SAME

CROSS-REFERENCE TO RELATED APPLICATION

This application claims the benefit of Korean Patent Application No. 2007-1027, filed Jan. 4, 2007, the disclosure of which is hereby incorporated herein by reference in its entirety.

BACKGROUND OF THE INVENTION

1. Field of the Invention

The present invention relates to an organic light emitting diode (OLED) display device capable of preventing damage of a pixel defining layer due to unevenness of a deposition mask using a plurality of ball-shaped spacers, and a method of fabricating the same.

2. Description of the Related Technology

In general, OLED display devices have an organic layer between a first electrode (e.g., anode) that is a transparent electrode formed of ITO and a second electrode (e.g., cathode) that is formed of a metal having a low work function, for example, calcium (Ca), lithium (Li), aluminum (Al), etc. When a forward voltage is applied to the OLED display device, a hole and an electron are emitted from the anode and the cathode and then recombined with each other to create an exciton, and as the exciton is converted from an excited state to a ground state, light is emitted.

Here, the organic layer may be formed by various methods, for example, deposition. To fabricate an OLED display device using deposition, a thin film with a predetermined pattern is formed by closely adhering a mask with the same pattern as that of the thin film to be formed to the surface which will have the thin film, and depositing a thin film material.

SUMMARY OF CERTAIN INVENTIVE ASPECTS

One aspect of the present invention provides an organic light emitting diode (OLED) display device and a method of fabricating the same, which prevents damage of a pixel defining layer due to unevenness of a deposition mask using ball-shaped spacers disposed over the pixel defining layer in forming an organic layer by the deposition mask.

Another aspect of the present invention provides an OLED display device which comprises: i) a substrate, ii) a first electrode disposed on the substrate, iii) a pixel defining layer disposed on the first electrode and including an opening and a non-opening part, iv) a plurality of ball-shaped spacers disposed on the non-opening part of the pixel defining layer, v) an organic layer disposed over the first electrode and including an emission layer and Vi) a second electrode disposed over the organic layer.

The OLED display device may further comprise a thin film transistor including a semiconductor layer having source and drain regions, and source and drain electrodes electrically connected to the semiconductor layer on the substrate, one of the source and drain electrodes being connected to the first electrode.

Another aspect of the present invention provides an OLED display device which comprises: i) a substrate, ii) a thin film transistor including a semiconductor layer having source and drain regions, and source and drain electrodes electrically connected to the semiconductor layer on the substrate, iii) a first electrode connected to one of the source and drain electrodes, and formed in a stacked structure of a lower electrode layer, a reflective electrode layer and an upper electrode layer, iv) a pixel defining layer disposed on the first electrode, and including an opening and a non-opening part, v) a plurality of ball-shaped spacers disposed on the non-opening part of the pixel defining layer, vi) an organic layer disposed over the first electrode and including an emission layer and vii) a second electrode disposed over the organic layer.

Still another aspect of the present invention provides a method of fabricating an OLED display device which comprises: i) providing a substrate, ii) forming a first electrode over the substrate, iii) forming a pixel defining layer over the first electrode, iv) spraying a plurality of ball-shaped spacers over the pixel defining layer, v) forming an opening in the pixel defining layer which exposes a portion of the first electrode and defines an emission region and simultaneously removing spacers disposed on the opening, vi) forming an organic layer disposed over the first electrode and including an emission layer and vii) forming a second electrode over the organic layer.

The method may further comprise forming a thin film transistor including a semiconductor layer having source and drain regions and source and drain electrodes electrically connected to the semiconductor layer on the substrate. One of the source and drain electrodes may be connected to the first electrode.

The method may further comprise exposing the pixel defining layer to form an opening in the pixel defining layer after forming the pixel defining layer.

The method may further comprise baking the substrate including the ball-shaped spacers after spraying the ball-shaped spacers.

The organic layer may be formed using a deposition mask.

BRIEF DESCRIPTION OF THE DRAWINGS

Embodiments of the present invention will be described in reference to the attached drawings.

DETAILED DESCRIPTION OF CERTAIN INVENTIVE EMBODIMENTS

Embodiments of the present invention will now be described more fully hereinafter with reference to the accompanying drawings, in which exemplary embodiments of the invention are shown. In the drawings, the lengths or thicknesses of layers and regions are exaggerated for clarity. The same reference numerals are used to denote the same elements throughout the specification.

Figure 1:
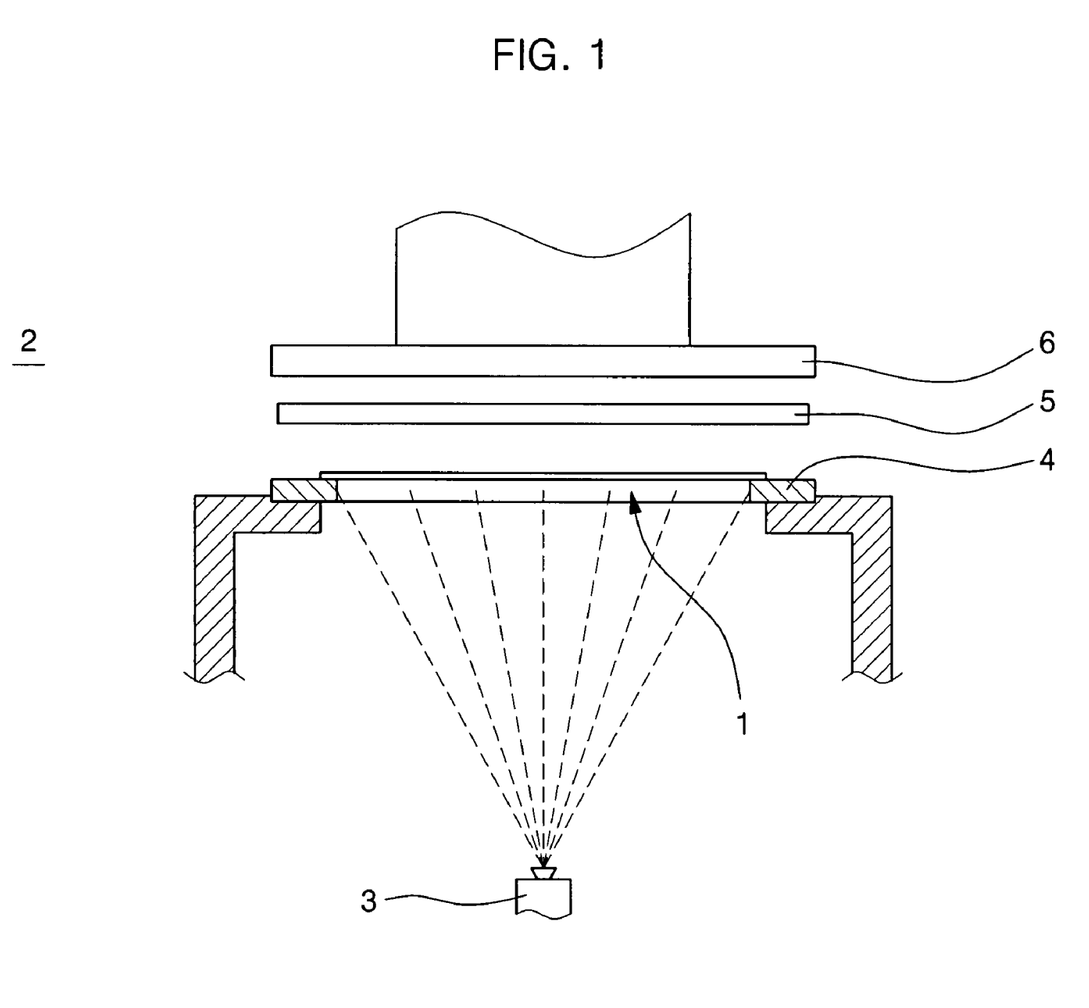
FIG. 1 is a schematic cross-sectional view of a deposition apparatus including a deposition mask.

FIG. 1 is a schematic cross-sectional view of a deposition apparatus including a deposition mask.

Referring to FIG. 1, to deposit a thin film of an OLED display device, i.e., an organic layer including an emission layer, using a mask 1, a frame 4 coupled with the mask is installed at a side corresponding to a thin film deposition crucible 3 installed in a vacuum chamber 2, and a target 5 on which a thin film will be formed is installed on the frame 4. The mask 1 supported by the frame 4 is closely adhered to the target 5 on which the thin film will be formed by a magnet unit 6. Here, a material is deposited onto the target 5 by operation of the thin film deposition crucible 3.

However, since an unevenness of about 2 μm to about 3 μm is formed on the surface of the mask 1, when the target 5 having a thin film to be formed is adhered to the mask 1, a scratch may be caused on a thin film of the target, i.e., on a pixel defining layer. Thus, a spacer structure is generally formed between the target and the surface of the mask 1 to prevent the scratch.

Figure 2A:
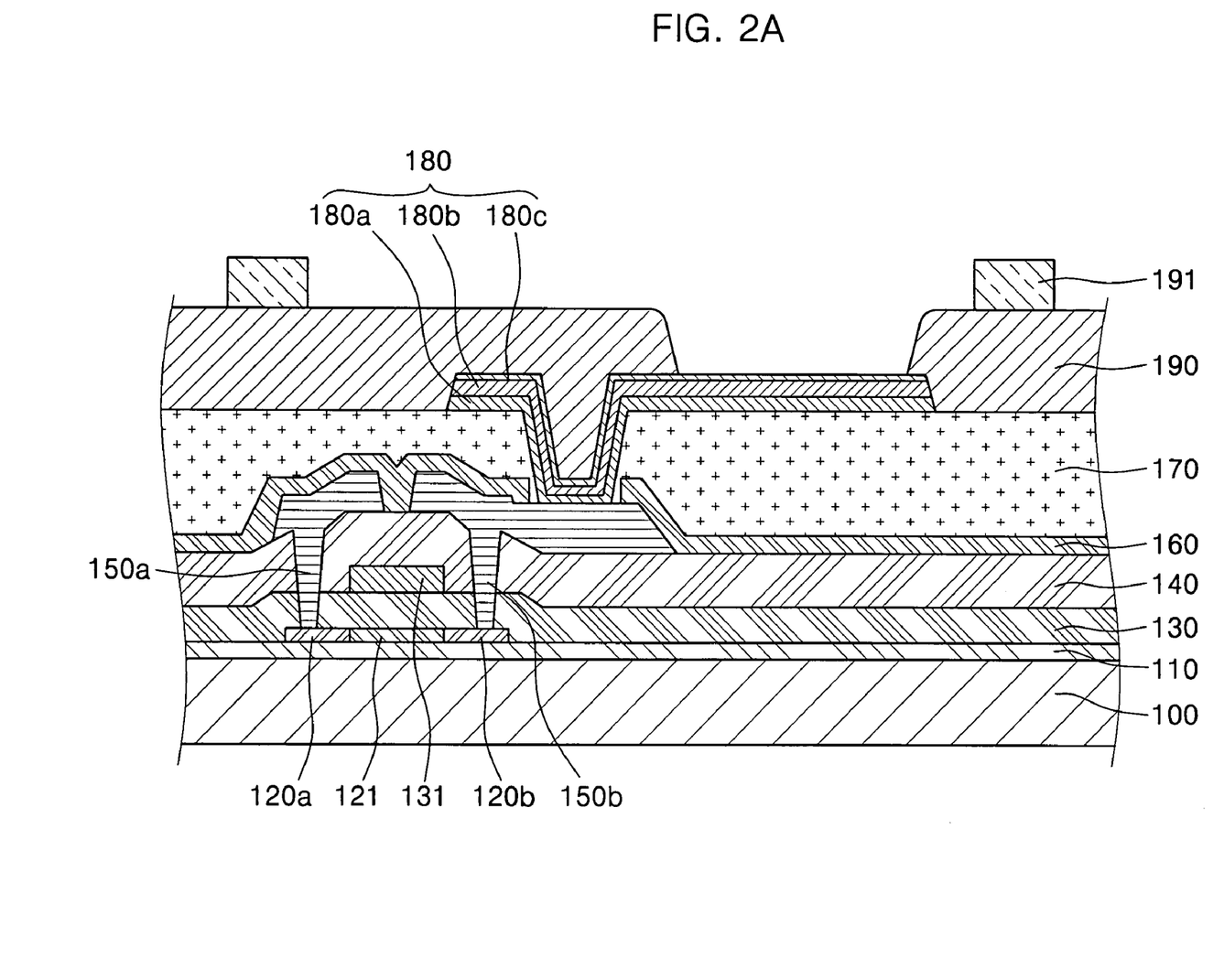
FIGS. 2A and 2B are cross-sectional views illustrating a typical method of fabricating an organic light emitting diode (OLED) display device.
Figure 2B:
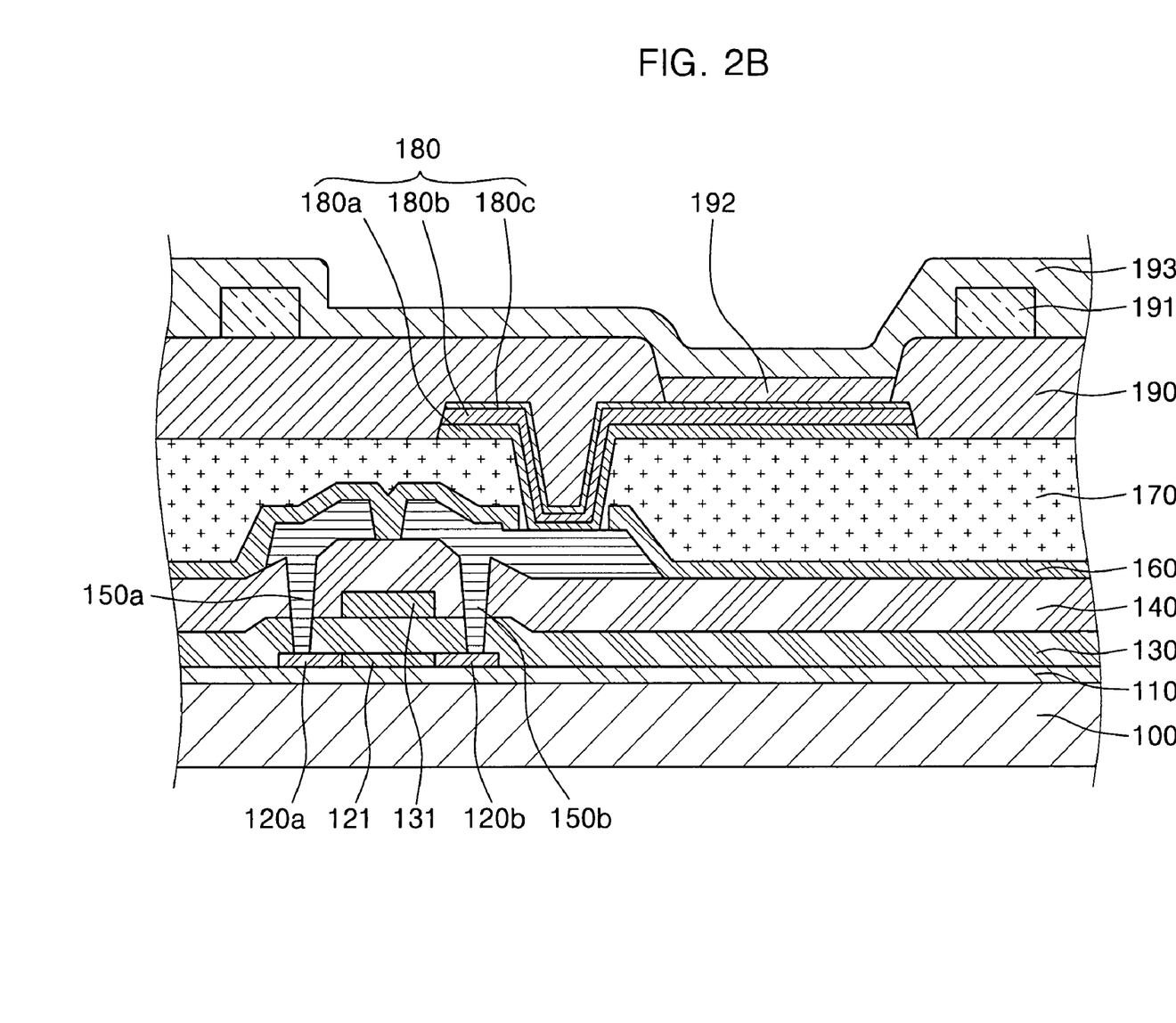

FIGS. 2A and 2B are cross-sectional views illustrating a method of fabricating a typical OLED display device.

Referring to FIG. 2A, the OLED display device includes a buffer layer 110 formed on a substrate 100, a semiconductor layer including a source region 120a, a drain region 120b and a channel region 121, which are formed on the buffer layer 110, a gate electrode 131 formed on a gate insulating layer 130, and source and drain electrodes 150a and 150b formed on an interlayer insulating layer and electrically connected to the source and drain regions 120a and 120b, respectively, through a contact hole.

An organic light emitting diode is formed on the substrate 100. The organic light emitting diode includes a first electrode 180, i.e., an anode formed on a passivation layer 160 and a planarization layer 170, which are formed over a thin film transistor and electrically connected to the drain electrode 150b through a via hole; and a pixel defining layer 190 exposing a certain region of the first electrode and including an opening to define a pixel.

Also, a spacer film is coated on the pixel defining layer 190, a photoresist layer (not illustrated) is formed over the spacer film, exposed and developed using a shadow mask, thereby forming a photoresist pattern (not illustrated). Then, a spacer pattern 191 is formed by patterning the spacer film using the photoresist pattern (not illustrated) as a mask.

Referring to FIG. 2B, an organic layer 192 including an emission layer is formed by a deposition apparatus including the deposition mask as described above. Also, a second electrode 193 is formed over the organic layer 192 by sputtering. When the organic layer 192 is formed by a deposition apparatus, the spacer pattern 191 serves to prevent damage of a pixel defining layer due to unevenness of the deposition mask caused when the deposition mask is adhered to the substrate having the pixel defining layer.

However, problems of the above-described OLED display device include an additional photolithography process for forming a spacer pattern, and low mass-productivity due to high cost for forming a spacer film.

Also, in the above-described OLED display device, a spacer pattern is formed by patterning a spacer film using a photolithography process, and thus part of the spacer film remains on the first electrode, which deteriorates the performance of the organic light emitting diode.

Figure 3:
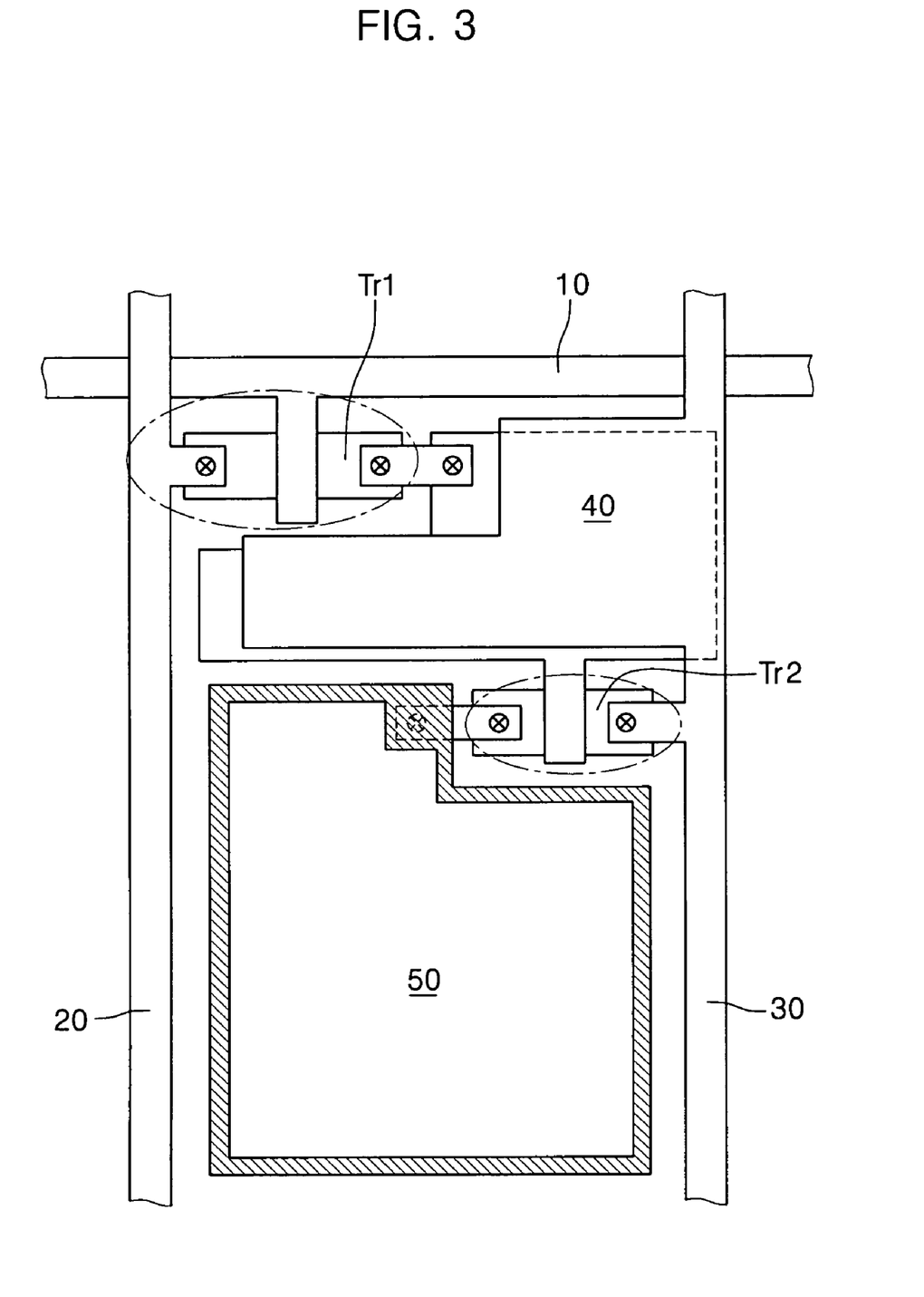
FIG. 3 is a plan view of a unit pixel of an OLED display device.

FIG. 3 is a plan view of a unit pixel of an organic light emitting diode (OLED) display device.

Referring to FIG. 3, one unit pixel includes a switching transistor Tr1, a driving transistor Tr2, a capacitor 40 and an organic light emitting diode 50, and emits light in response to a signal. Also, a gate line 10, a data line 20 and a power supply line 30 are connected to each element.

The switching transistor Tr1 is driven by a scan signal applied to the gate line 10, and serves to transmit a data signal applied to the data line 20 to the driving transistor Tr2.

The driving transistor Tr2 determines an amount of current flowing through the organic light emitting diode 50 by the data signal transmitted from the switching transistor Tr1 and a signal transmitted from the power supply line 30, i.e., a voltage difference between a gate and a source.

Also, the capacitor 40 serves to store the data signal transmitted from the switching transistor Tr1 for one frame.

FIGS. 4A to 4E are cross-sectional views illustrating a method of fabricating an OLED display device according to an exemplary embodiment of the present invention.

Figure 4A:
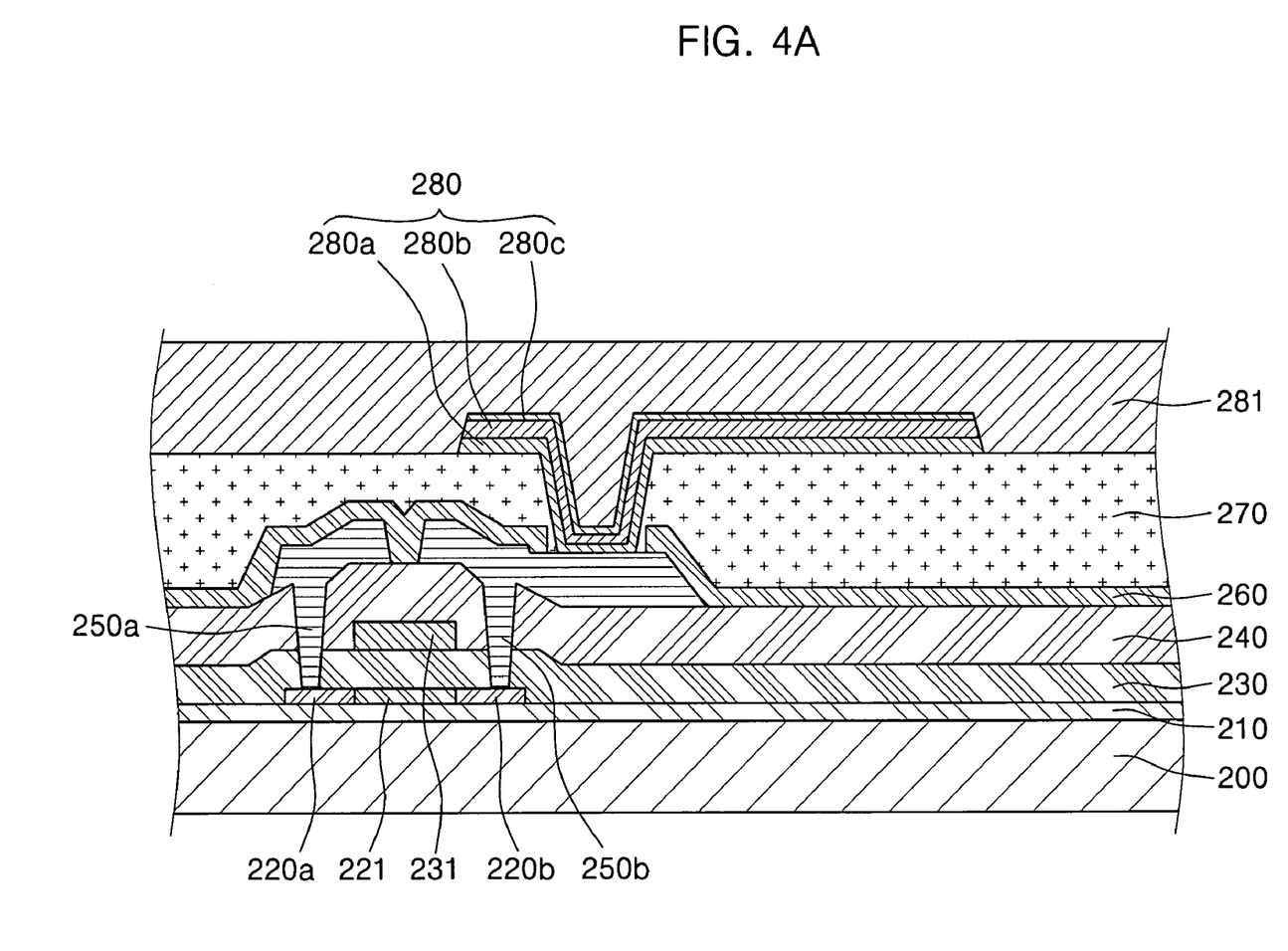
FIGS. 4A to 4E are cross-sectional views illustrating a method of fabricating an OLED display device according to an exemplary embodiment of the present invention.

Referring to FIG. 4A, a buffer layer 210 having a predetermined thickness is formed of silicon oxide on the entire surface of a transparent insulating substrate 200 using plasma-enhanced chemical vapor deposition (PECVD). Here, the buffer layer 210 serves to prevent diffusion of impurities in the transparent insulating substrate 200 during crystallization of an amorphous silicon layer to be formed later.

An amorphous silicon layer (not illustrated), that is a semiconductor layer, is deposited to a predetermined thickness over the buffer layer 210. Then, a semiconductor layer pattern is formed in a unit pixel by crystallizing the amorphous silicon layer using one of excimer laser annealing (ELA), sequential lateral solidification (SLS), metal induced crystallization (MIC) and metal induced lateral crystallization (MILC), and patterning the amorphous silicon layer by a photolithography process.

A gate insulating layer 230 is formed on the entire surface of the substrate including the semiconductor layer pattern. Here, the gate insulating layer 230 may be a silicon oxide ($SiO_2$) layer, a silicon nitride ($SiN_x$) layer, or a double layer thereof.

A gate electrode 231 is formed in a certain region corresponding to a channel region 221 of the semiconductor layer pattern on the gate insulating layer 230. The gate electrode 231 may be formed of one selected from the group consisting of aluminum (Al), an Al alloy, molybdenum (Mo) and a Mo alloy.

Then, source and drain regions 220a and 220b are formed by injecting impurities into the semiconductor layer pattern 220 using the gate electrode 231 as an ion injection mask. Here, the ion injection process is performed using an n+ or p+ impurity as a dopant.

An interlayer insulating layer 240 is formed to a predetermined thickness over the entire surface of the resultant structure. Here, the interlayer insulating layer 240 may be a $SiO_2$ layer, a $SiN_x$ layer, or a double layer thereof.

The interlayer insulating layer 240 and the gate insulating layer 230 are etched by a photolithography process so as to form a contact hole which exposes the source and drain regions 220a and 220b.

Source and drain electrode materials are formed over the entire surface of the resultant structure including the contact hole and then etched by a photolithography process so as to form source and drain electrodes 250a and 250b, which are connected to the source and drain regions 220a and 220b, respectively. Here, the source and drain electrodes 250a and 250b have a single-layered structure formed of one selected from the group consisting of Mo, W, MoW, AlNd, Ti, Al, an Al alloy, Ag and an Ag alloy; or a double or more-layered structure formed of low resistance materials such as Mo, Al and Ag, i.e., a stacked structure selected from the group consisting of Mo/Al/Mo, MoW/Al—Nd/MoW, Ti/Al/Ti, Mo/Ag/Mo and Mo/Ag alloy/Mo, in order to reduce interconnection resistance.

An insulating layer may be disposed over the source and drain electrodes 250a and 250b, and be an inorganic layer 260, an organic layer 270 or a double layer thereof. Also, a first electrode layer 280 is disposed on the insulating layer to be connected through a via hole in the insulating layer.

The first electrode layer 280 may be a transparent electrode in a bottom-emission OLED display device, or a reflective electrode in a top-emission OLED display device. Here, the transparent first electrode may be formed of one selected from the group consisting of indium tin oxide (ITO), indium zinc oxide (IZO), tin oxide (TO) and zinc oxide (ZnO). The reflective first electrode may be formed by stacking a reflective layer formed of one selected from the group consisting of Ag, Mg, Al, Pt, Pd, Au, Ni, Nd, Ir, Cr and a compound thereof, and a transparent electrode formed of one selected from the group consisting of ITO, IZO, TO and ZnO on the reflective layer.

Also, the first electrode layer 280 may be formed in a stacked structure of a lower electrode layer 280a, a reflective electrode layer 280b and an upper electrode layer 280c in the top-emission OLED display device.

The lower electrode layer 280a may be formed of one selected from the group consisting of ITO, IZO, TO and ZnO. Here, the lower electrode layer 280a is formed to a thickness of about 50 Å to about 100 Å. When the thickness of the lower electrode layer 280a is less than about 50 Å, uniformity may be difficult to be ensured; whereas, when more than about 100 Å, adhesion may become weak due to stress that the lower electrode layer itself has.

The reflective electrode layer 280b may be formed of one selected from the group consisting of Al, an Al alloy, Ag and an Ag alloy, and formed to a thickness of about 900 Å to about 2000 Å. When the thickness is less than about 900 Å, the reflective electrode layer may partially transmit light, and when more than about 1000 Å, the reflective electrode layer may not transmit light any more. Moreover, when the thickness is more than about 2000 Å, both cost and processing time may increase.

Here, the reflective electrode layer 280b serves to reflect light, thereby increasing brightness and light efficiency.

The upper electrode layer 280c may be formed of one selected from the group consisting of ITO, IZO, TO and ZnO. Here, the upper electrode layer 280c may be formed to a thickness of about 50 Å to 100 Å. When the thickness of the upper electrode layer 280c is less than about 50 Å, uniformity of the thin film may not be ensured; whereas, when more than about 100 Å, reflectance in a blue light region may be lowered more than about 10% to 15% due to an interference effect.

An insulating layer is formed on the first electrode 280. Here, the insulating layer may be a pixel defining layer 281.

The pixel defining layer 281 may be formed of one selected from the group consisting of polyacrylates resin, epoxy resin, phenolic resin, polyamides resin, polyimides resin, unsaturated polyesters resin, poly(phenylenethers) resin, poly(phenylenesulfides) resin and benzocyclobutene (BCB).

Here, the pixel defining layer 281 may be formed of a positive material or a negative material.

The structure of the positive material is softened in a portion to which light is irradiated during a photolithography process, and thus the portion is removed during a developing process. However, the structure of the negative material is hardened in the portion to which light is irradiated during the photolithography process, and thus a portion to which light is not irradiated is removed during the developing process.

A certain region of the first electrode is exposed on the pixel defining layer 281, and an opening defining an emission region is formed by the photolithography process.

Figure 4B:
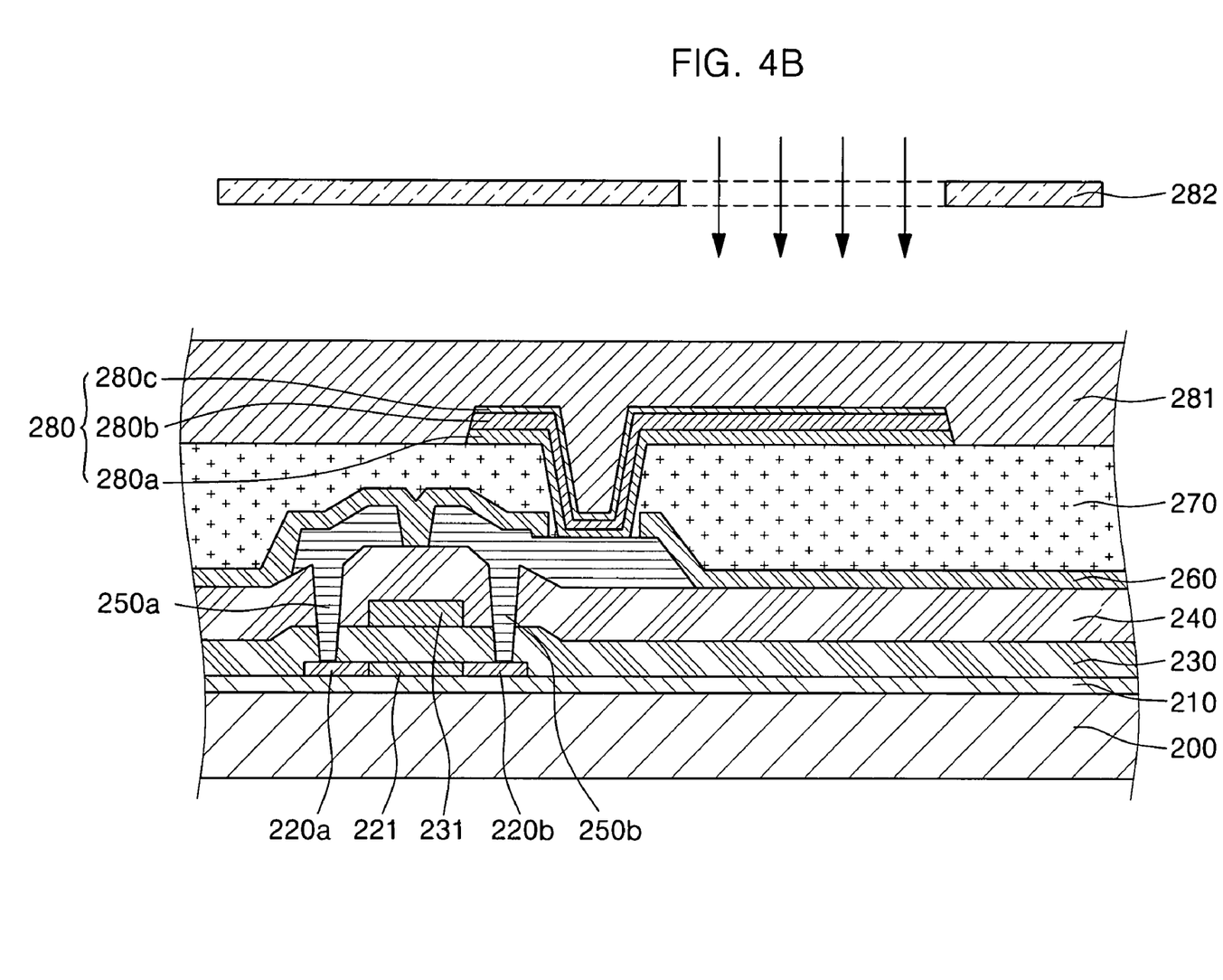

Referring to FIG. 4B, in the photolithography process, the pixel defining layer is first exposed using a shadow mask 282.

Here, the structure of the shadow mask may depend on a material of the pixel defining layer.

That is, as illustrated in FIG. 4B, when the pixel defining layer is formed of a positive material, the shadow mask 282 has a transmission region in which an opening is to be formed, and a blocking region except for the opening. Light is irradiated to the region in which an opening is to be formed through the shadow mask to soften the structure of the region where light is irradiated, so that the region where light is irradiated is removed in the subsequent developing process.

Also, not illustrated in the drawing, when the pixel defining layer is formed of a negative material, the shadow mask has a blocking region in which an opening is to be formed, and a transmission region except for the opening. Light is irradiated to the region except for the opening through the shadow mask to harden the structure of the region where light is irradiated, so that the region where light is not irradiated is removed in the subsequent developing process.

Figure 4C:
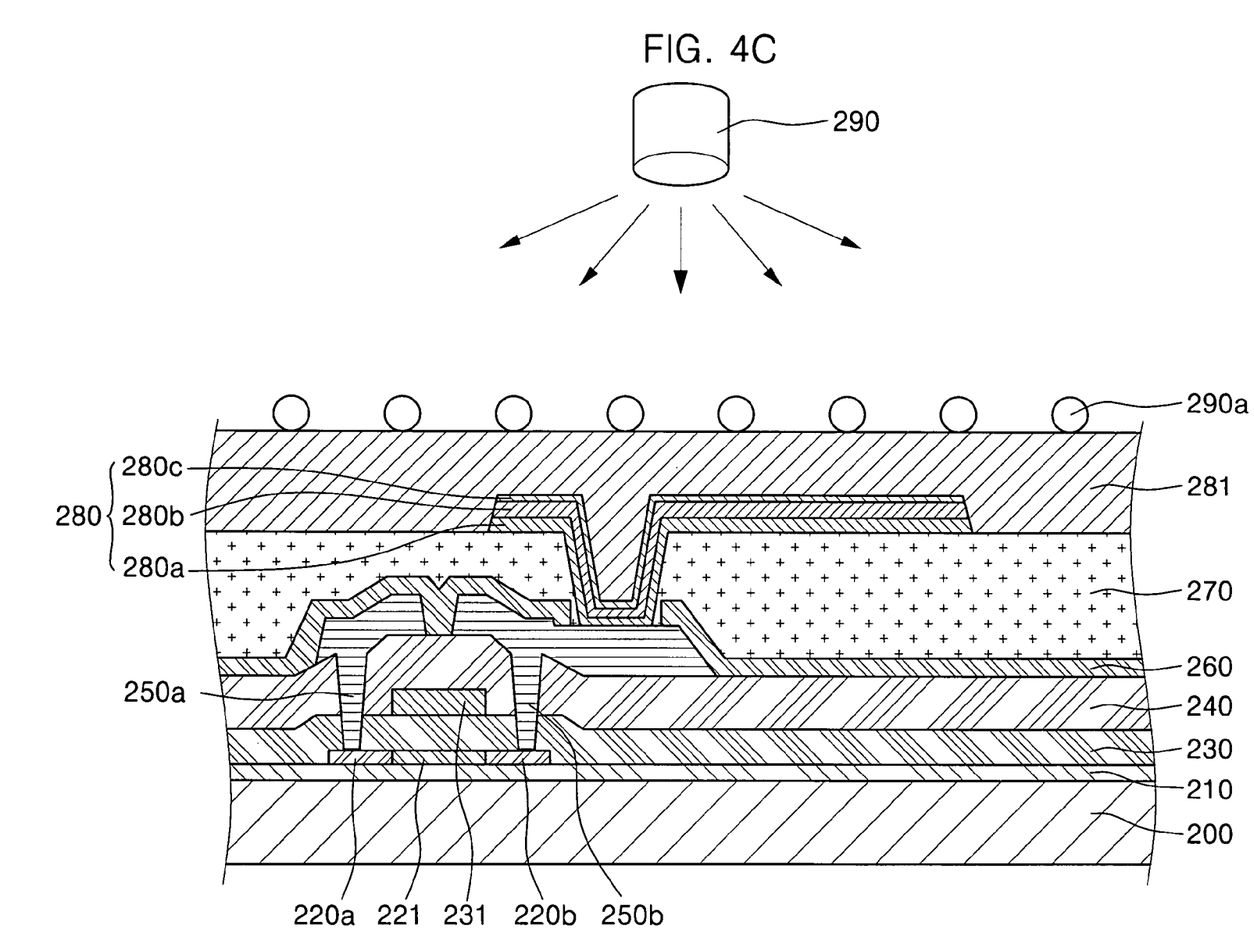

In one embodiment, as shown in FIG. 4C, the pixel defining layer 281 is exposed by the shadow mask 282, and then ball-shaped spacers 290a are applied onto the pixel defining layer 281.

Here, the ball-shaped spacers 290a may be applied using a spacer sprayer 290. In another embodiment, spacers other than ball-shaped may be applied. Cross-sections of such spacers may be, for example, circular, triangular, rectangular, pentagonal, hexagonal, other polygonal, or combination thereof. In one embodiment, only part of spacers is ball-shaped and others are not. In another embodiment, the spacers 290a may be provided on the pixel defining layer 281 using other applying methods.

Subsequently, the ball-shaped spacers 290a may be baked to be fixed onto the pixel defining layer 281. The baking process may be performed at a temperature of about 50° C. to about 200° C.

Figure 5A:
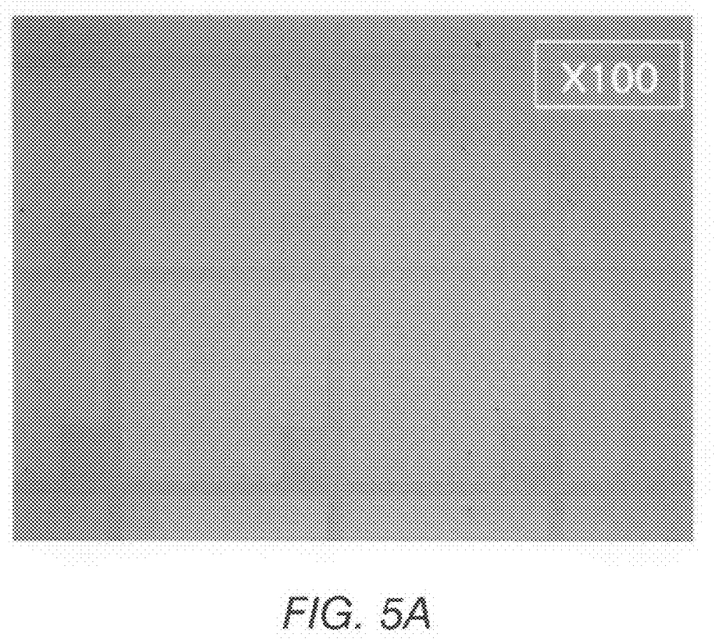
FIGS. 5A and 5B are photographs of the OLED display device before and after a developing process without performing a baking process.
Figure 5B:
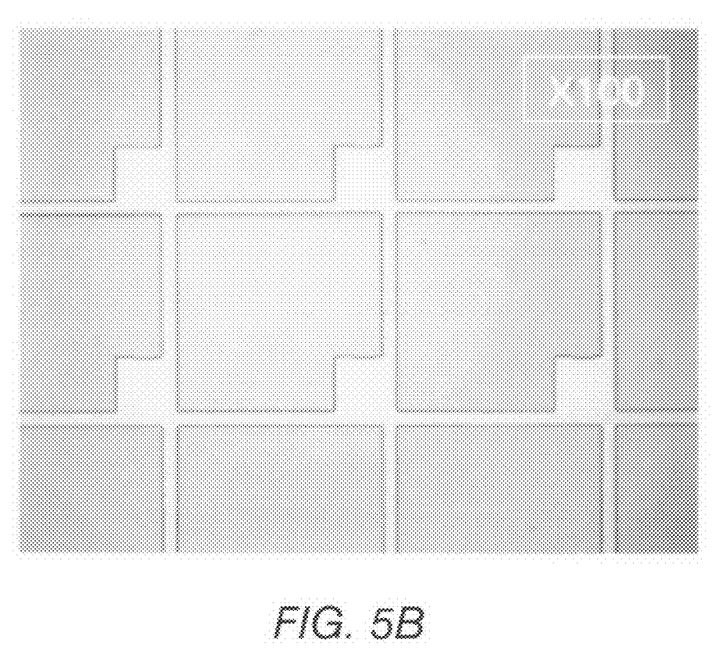

FIGS. 5A and 5B are photographs of the OLED display device before and after a developing process without performing the baking process.

As can be seen from FIG. 5A, before the developing process, the ball-shaped spacers are deposed on the pixel defining layer, but as can be seen from FIG. 5B, after the developing process, the ball-shaped spacers (see black dots in FIG. 5B) may be completely removed from the surface of the pixel defining layer.

Figure 6A:
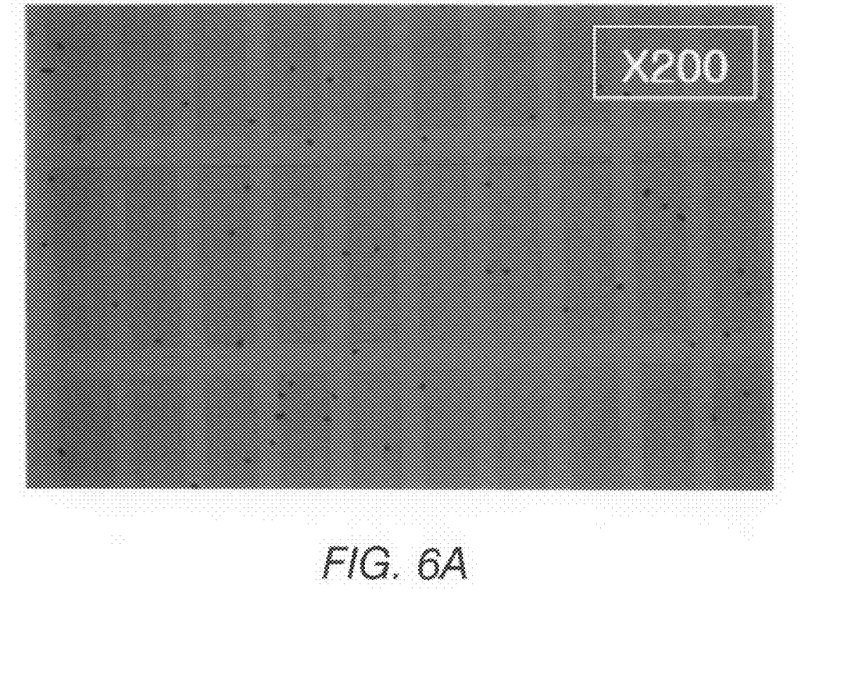
FIGS. 6A and 6B are photographs of the OLED display device before and after a developing process after performing a baking process.
Figure 6B:
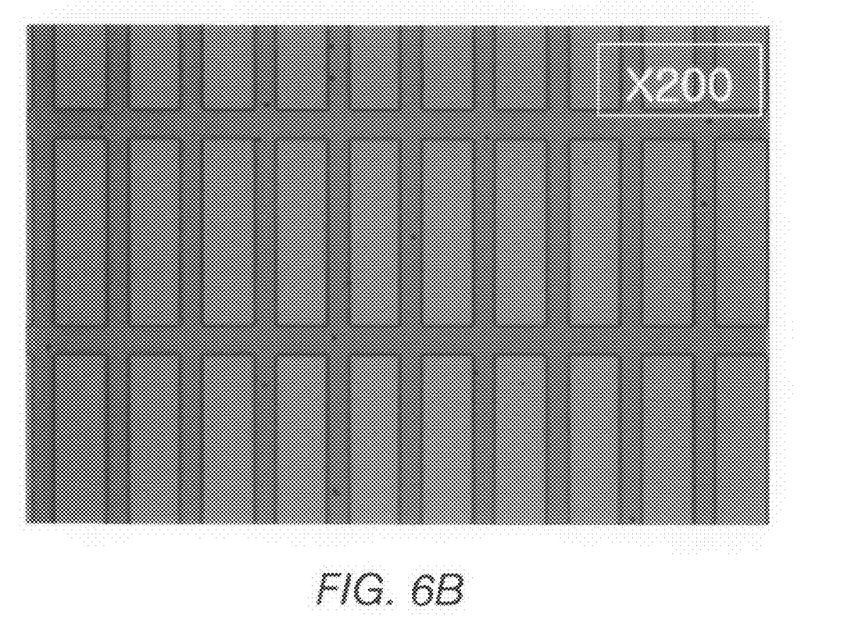

FIGS. 6A and 6B are photographs of the OLED display device before and after a developing process after performing the baking process.

As can be seen from FIG. 6A, the ball-shaped spacers are on the pixel defining layer before the developing process, and as can be seen from FIG. 6B, the ball-shaped spacers (see black dots in FIG. 6B) are still disposed on the pixel defining layer after the developing process.

Figure 4D:
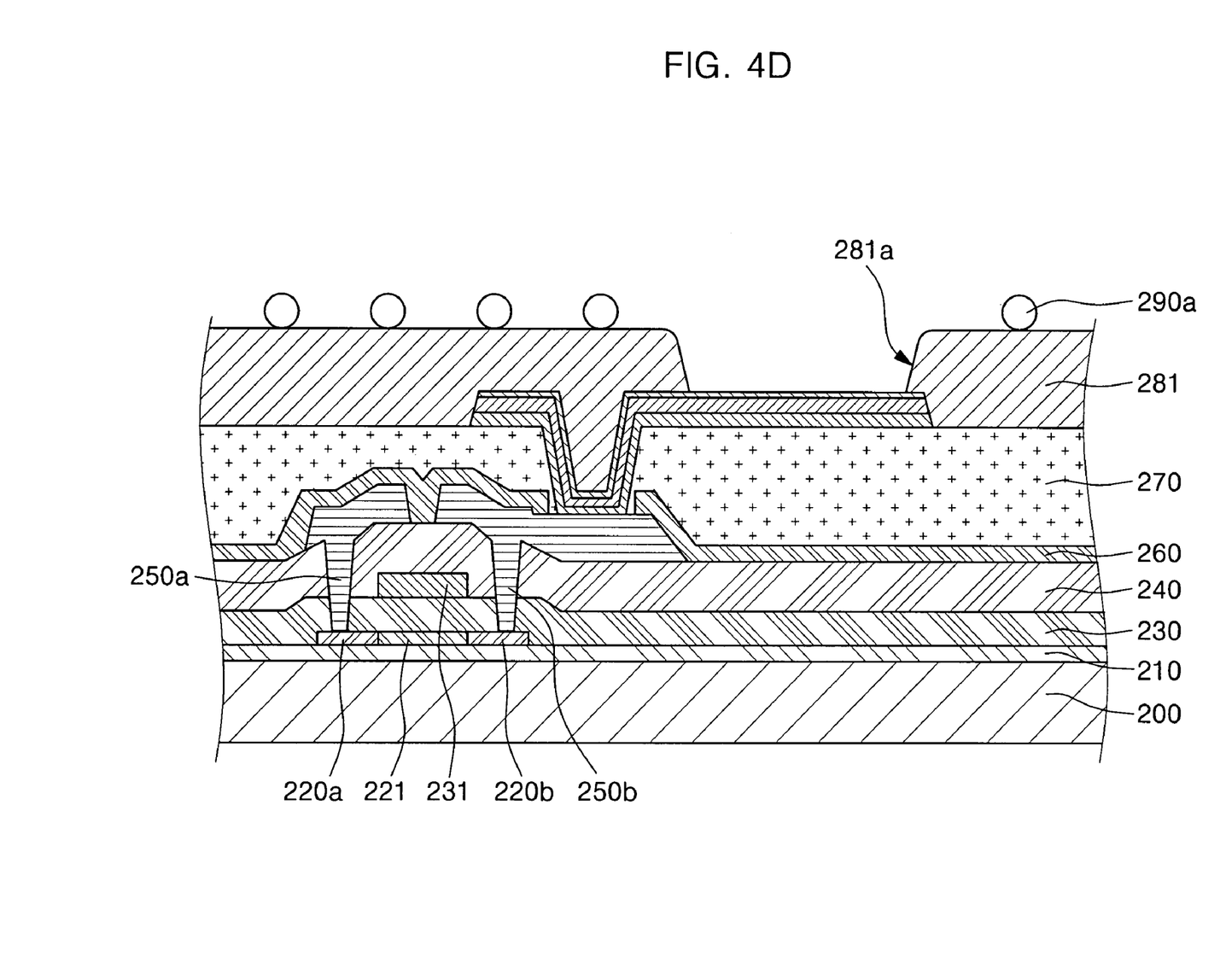

Then, referring to FIG. 4D, after the baking process, the pixel defining layer is developed to expose a certain region of the first electrode on the pixel defining layer, and to form an opening 281a which defines an emission region.

When the pixel defining layer is formed of a positive material, the opening is formed by removing the part of the pixel defining layer predetermined as the opening to which light is irradiated, together with the ball-shaped spacers disposed thereon in the developing process. Here, the ball-shaped spacers disposed on the region except for the opening still remain on the pixel defining layer.

Alternatively, when the pixel defining layer is formed of a negative material, the opening is formed by removing the part of the pixel defining layer predetermined as the opening to which light is not irradiated, together with the ball-shaped spacers disposed thereon in the developing process. Here, the ball-shaped spacers disposed on the region except for the opening still remain on the pixel defining layer.

Figure 4E:
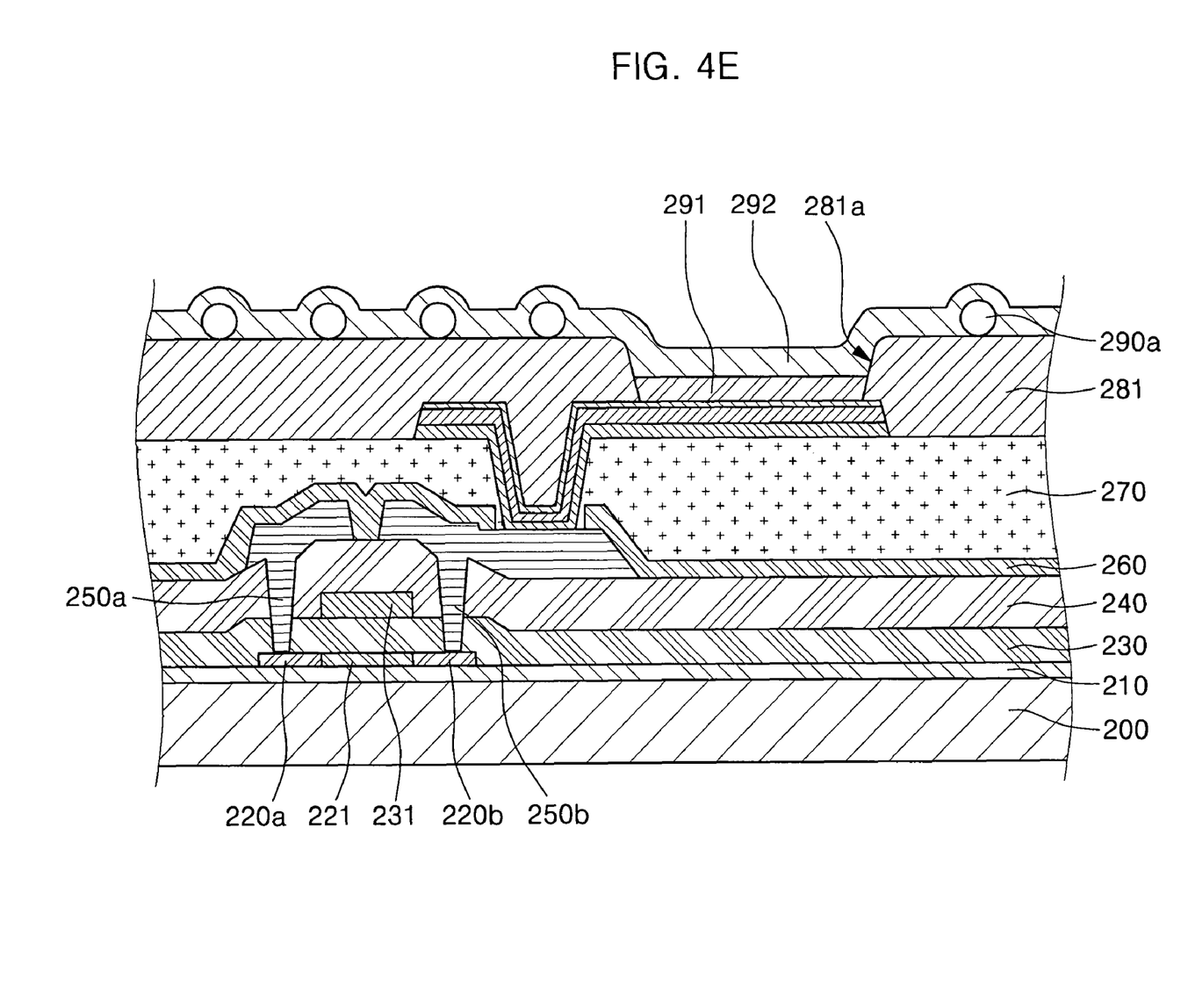

Referring to FIG. 4E, an organic layer 291 including an emission layer disposed on the first electrode 280, and then a second electrode 292 is formed on the organic layer 291.

The organic layer 291 including the emission layer is formed using a deposition apparatus including a deposition mask. In one embodiment, the ball-shaped spacers serve to prevent damage of the pixel defining layer due to unevenness of the deposition mask caused when the deposition mask is closely adhered on the substrate having the pixel defining layer.

In one embodiment, a pixel defining layer is formed over a first electrode, a part predetermined as an opening and a region except for the opening are exposed through a shadow mask, ball-shaped spacers are applied and then fixed onto the pixel defining layer by a baking process, and the part predetermined as the opening defining an emission region is developed, thereby disposing the ball-shaped spacers on the region except for the opening so as to prevent damage of the pixel defining layer due to unevenness of the deposition mask.

Accordingly, according to at least one embodiment, the method of fabricating an OLED display device may omit a photolithography process for forming a spacer pattern, thereby preventing deterioration in performance of an organic light emitting diode, which is caused by a remaining spacer film on the first electrode.

The organic layer 291 includes an emission layer, and may further include at least one of a hole injection layer, a hole transport layer, an electron transport layer and an electron injection layer.

The hole transport layer may be formed of a material such as N,N'-di(naphthalene-1-yl)-N,N'-diphenyl-benzidine (α-NPB), or N,N'-bis(3-methylphenyl)-N,N'-diphenyl-[1,1'-biphenyl]-4,4'-diamine (TPD). The hole transport layer may be formed to a thickness of about 10 nm to about 50 nm.

The hole transport layer may further include a dopant, which can emit light by electron-hole combination in addition to the hole transport material. The dopant may include 4-(dicyanomethylene)-2-t-butyl-6-(1,1,7,7-tetramethyljulolidyl-9-enyl)-4H-pyran (DCJTB), coumarin 6, rubrene, DCM, DCJTB, perylene or quinacridone, and its content may be about 0.1 wt % to about 5 wt % with respect to the total weight of the material for the hole transport layer. When the dopant is added during the formation of the hole transport layer, an emission color may be controlled according to the kind and content of the dopant, and the thermal stability of the hole transport layer may increase, thereby improving the life-span of the device.

Also, the hole injection layer may be formed of a starbust amine-based compound, and its thickness may be about 30 nm to about 100 nm. The characteristics of the device may be generally improved by reducing contact resistance between a counter electrode and a hole transport layer, and improving hole transport ability of an anode through the hole injection layer.

In one embodiment, an example of a material for the emission layer is 4,4'-bis(carbazol-9-yl)-biphenyl (CBP), but it is not specially limited thereto.

The emission layer may further include a dopant that can emit light by electron-hole combination as the aforementioned hole transport layer, and the kind and content of the dopant may be the same as those of the hole transport layer. Here, the emission layer may be formed to a thickness of about 10 nm to about 40 nm.

The electron transport layer is formed of a material such as tris(8-quinolinolate)-aluminum (Alq3), Almq3, etc., and may further include a dopant which can emit light by the electron-hole combination as the aforementioned hole transport layer. The kind and content of the dopant may be almost the same as those of the hole transport layer. Here, the electron transport layer may be formed to a thickness of about 30 nm to about 100 nm.

A hole blocking layer (HBL) may be further formed between the emission layer and the electron transport layer. Here, the hole blocking layer serves to prevent the transfer of an exciton created from a phosphorescent emitting material to the electron transport layer, or the transfer of a hole to the electron transport layer, and may be formed of BAlq.

The electron injection layer may be formed of a material containing LiF, and its thickness may range from about 0.1 nm to about 10 nm.

The second electrode 292 over the organic layer may be a reflective type, and formed of one selected from the group consisting of Li, Ca, LiF/Ca, LiF/Al, Al, Mg and an alloy thereof in a bottom-emission OLED display device.

Also, the second electrode 292 over the organic layer may be a semi-transmission cathode, or a combination of a semi-transmission cathode and a transmission cathode in a top-emission OLED display device. The semi-transmission cathode may be formed to a thickness of about 5 nm to about 30 nm using one material selected from the group consisting of Li, Ca, LiF/Ca, LiF/Al, Al, Mg and a Mg alloy, and the combination may be formed by forming a semi-transmission cathode using one selected from the group consisting of Li, Ca, LiF/Ca, LiF/Al, Al, Mg and a Mg alloy having a low work function, and then forming an additional layer using ITO or IZO having a low resistance characteristic. Here, when the thickness of the semi-transmission cathode is less than about 5 nm, electrons are not injected at a low voltage, and when more than about 30 nm, transmittance drops significantly. Also, the total thickness of the semi-transmission cathode and the transmission cathode may properly be about 10 nm to about 400 nm.

According to at least one embodiment of the present invention, an OLED display device uses ball-shaped spacers disposed over a pixel defining layer in forming an organic layer including an emission layer using a deposition mask, thereby preventing damage of the pixel defining layer due to unevenness of the deposition mask and omitting a typical process for forming a spacer pattern.

As a result, a photography process for forming a spacer pattern may be omitted, thereby preventing an increase in production cost.

Moreover, a process of patterning a spacer film is omitted, so that, it is possible to prevent deterioration in performance of an organic light emitting diode due to a remaining spacer film on a first electrode.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. An organic light emitting diode (OLED) display device, comprising:
   a substrate;
   a first electrode formed over the substrate;
   a pixel defining layer formed over the first electrode, wherein an opening is defined in the pixel defining layer, and wherein the pixel defining layer comprises a non-opening portion;
   a plurality of ball-shaped spacers formed on the non-opening portion of the pixel defining layer;
   an organic layer formed over the first electrode, wherein the organic layer comprises an emission layer, wherein none of the plurality of ball-shaped spacers contact the organic layer; and
   a second electrode formed over the organic layer and the plurality of ball-shaped spacers, wherein the second electrode covers substantially all the surfaces of the plurality of ball-shaped spacers.

2. The device according to claim 1, wherein the pixel defining layer is formed of at least one selected from the group consisting of polyacrylates resin, epoxy resin, phenolic resin, polyamides resin, polyimides resin, unsaturated polyesters resin, poly (phenylenethers) resin, poly (phenylenesulfides) resin and benzocyclobutene (BCB).

3. The device according to claim 1, wherein the first electrode is formed of at least one selected from the group consisting of indium tin oxide (ITO), indium zinc oxide (IZO), tin oxide (TO) and zinc oxide (ZnO), and the second electrode is formed of one selected from the group consisting of Li, Ca, LiF/Ca, Al, Mg and an alloy thereof.

4. The device according to claim 1, wherein the first electrode is a formed in a stacked structure of i) a reflective layer, which is formed of one selected from the group consisting of Ag, Mg, Al, Pt, Pd, Au, Ni, Nd, Ir, Cr and a compound thereof, and ii) a transparent electrode, which is formed of at least one selected from the group consisting of ITO, IZO, TO and ZnO, and wherein the second electrode is formed of at least one selected from the group consisting of Li, Ca, LiF/Ca, LiF/Al, Al, Mg and a Mg alloy.

5. The device according to claim 4, wherein the second electrode is formed to a thickness of about 5 nm to about 30 nm.

6. The device according to claim 1, further comprising:
   a thin film transistor comprising i) a semiconductor layer having source and drain regions and ii) source and drain electrodes electrically connected to the semiconductor layer on the substrate, wherein one of the source and drain electrodes is connected to the first electrode.

7. An organic light emitting diode (OLED) display device, comprising:
   a substrate;
   a thin film transistor comprising i) a semiconductor layer having source and drain regions and ii) source and drain electrodes electrically connected to the semiconductor layer on the substrate;
   a first electrode connected to one of the source and drain electrodes, wherein the first electrode comprises first and second electrode layers and a reflective electrode layer interposed between the two electrode layers;
   a pixel defining layer formed over the first electrode, wherein an opening is defined in the pixel defining layer, and wherein the pixel defining layer comprises a non-opening portion;
   a plurality of spacers formed on the non-opening portion of the pixel defining layer, wherein at least one of the plurality of spacers is ball-shaped;
   an organic layer formed over the first electrode, wherein the organic layer comprises an emission layer, wherein the at least one ball-shaped spacer does not contact the organic layer; and
   a second electrode formed over the organic layer and the plurality of spacers, wherein the second electrode covers substantially all the surfaces of the at least one ball-shaped spacers.

8. The device according to claim 7, wherein the pixel defining layer is formed of at least one selected from the group consisting of polyacrylates resin, epoxy resin, phenolic resin, polyamides resin, polyimides resin, unsaturated polyesters resin, poly (phenylenethers) resin, poly (phenylenesulfides) resin and benzocyclobutene (BCB).

9. The device according to claim 7, wherein the first electrode layer is formed of at least one selected from the group consisting of ITO, IZO, TO and ZnO.

10. The device according to claim 7, wherein the reflective electrode layer is formed of at least one selected from the group consisting of Al, an Al alloy, Ag, and an Ag alloy.

11. The device according to claim 7, wherein the second electrode layer is formed of at least one selected from the group consisting of ITO, IZO, TO and ZnO.

12. The device according to claim 7, wherein the first electrode layer has a thickness of about 50 Å to about 100 Å.

13. The device according to claim 7, wherein the reflective electrode layer has a thickness of about 900 Å to about 2000 Å.

14. The device according to claim 7, wherein the second electrode layer has a thickness of about 50 Å to about 100 Å.

15. A method of fabricating an organic light emitting diode (OLED) display device, comprising:
   providing a substrate;
   forming a first electrode over the substrate;
   forming a pixel defining layer over the first electrode;
   spraying a plurality of spacers over the pixel defining layer, wherein the plurality of spacers comprise at least one ball-shaped spacer;
   forming an opening in the pixel defining layer which exposes a portion of the first electrode and defines an emission region and simultaneously removing spacers disposed on the opening;
   forming an organic layer over the first electrode, wherein the at least one ball-shaped spacer does not contact the organic layer; and
   forming a second electrode over i) the organic layer and ii) the plurality of spacers, wherein the second electrode covers substantially all the surfaces of the at least one ball-shaped spacers.

16. The method according to claim 15, further comprising;
   after forming the pixel defining layer,
   exposing the pixel defining layer to form the opening in the pixel defining layer.

17. The method according to claim 16, wherein the pixel defining layer is exposed using a shadow mask.

18. The method according to claim 15, wherein the shadow mask has a part predetermined as an opening, which is a transmission region, and has a non-opening part, which is a blocking region, when the pixel defining layer is formed of a positive material.

19. The method according to claim 15, wherein the shadow mask has a part predetermined as an opening, which is a blocking region, and has a non-opening part, which is a transmission region, when the pixel defining layer is formed of a negative material.

20. The method according to claim 15, further comprising:
after spraying the spacers,
baking the substrate including the spacers.

21. The method according to claim 20, wherein the baking is performed at a temperature of about 50° C. to about 200° C.

22. The method according to claim 15, wherein the organic layer is formed using a deposition mask.

23. The method according to claim 15, wherein the spraying uses a spacer sprayer.

24. The method according to claim 15, further comprising:
forming a thin film transistor including a semiconductor layer having source and drain regions and source and drain electrodes electrically connected to the semiconductor layer on the substrate, one of the source and drain electrodes being connected to the first electrode.

* * * * *